United States Patent
Sasaki

(10) Patent No.: US 9,685,515 B2
(45) Date of Patent: Jun. 20, 2017

(54) SUBSTRATE FOR EPITAXIAL GROWTH, AND CRYSTAL LAMINATE STRUCTURE

(71) Applicant: TAMURA CORPORATION, Tokyo (JP)

(72) Inventor: Kohei Sasaki, Tokyo (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

(21) Appl. No.: 14/851,210

(22) Filed: Sep. 11, 2015

(65) Prior Publication Data

US 2016/0233307 A1    Aug. 11, 2016

Related U.S. Application Data

(63) Continuation of application No. 14/343,028, filed as application No. PCT/JP2012/069975 on Aug. 6, 2012, now Pat. No. 9,142,623.

(30) Foreign Application Priority Data

Sep. 8, 2011   (JP) .................. 2011-196429

(51) Int. Cl.
*H01L 29/12* (2006.01)
*H01L 31/07* (2012.01)
(Continued)

(52) U.S. Cl.
CPC ............ *H01L 29/24* (2013.01); *C30B 23/066* (2013.01); *C30B 29/16* (2013.01); *C30B 29/22* (2013.01);
(Continued)

(58) Field of Classification Search
CPC .......... H01L 27/1225; H01L 21/02565; H01L 33/42; H01L 21/02639; H01L 21/02433;
(Continued)

(56) References Cited

U.S. PATENT DOCUMENTS 8,262,796 B2    9/2012   Ichinose et al.
8,816,349 B2 *  8/2014   Yamazaki ......... H01L 21/76828
                                                    257/43
(Continued)

FOREIGN PATENT DOCUMENTS

CN        100370065 C     2/2008
EP        1 598 450 A2   11/2005
(Continued)

OTHER PUBLICATIONS

Chinese Office Action dated Nov. 4, 2015 with English translation.
(Continued)

*Primary Examiner* — Hsien Ming Lee
(74) *Attorney, Agent, or Firm* — McGinn IP Law Group, PLLC.

(57) ABSTRACT

A crystal laminate structure includes an epitaxial growth substrate including a $\beta$-$Ga_2O_3$-based single crystal and a (010) plane or a plane inclined at an angle not more than 37.5° with respect to the (010) plane as a main surface thereof and a high electrical resistance, and an epitaxial crystal formed on the main surface of the epitaxial growth substrate. The epitaxial crystal includes a Ga-containing oxide.

13 Claims, 12 Drawing Sheets

(51) Int. Cl.

| | | |
|---|---|---|
| *H01L 29/24* | (2006.01) | |
| *C30B 29/16* | (2006.01) | |
| *H01L 21/02* | (2006.01) | |
| *C30B 23/06* | (2006.01) | |
| *C30B 29/22* | (2006.01) | |
| *C30B 29/68* | (2006.01) | |
| *H01L 29/04* | (2006.01) | |
| *C30B 13/00* | (2006.01) | |
| *C30B 15/34* | (2006.01) | |

(52) U.S. Cl.
CPC .......... *C30B 29/68* (2013.01); *H01L 21/0262* (2013.01); *H01L 21/02414* (2013.01); *H01L 21/02433* (2013.01); *H01L 21/02565* (2013.01); *H01L 21/02576* (2013.01); *H01L 21/02579* (2013.01); *H01L 21/02631* (2013.01); *H01L 29/04* (2013.01); *H01L 29/045* (2013.01); *C30B 13/00* (2013.01); *C30B 15/34* (2013.01)

(58) Field of Classification Search
CPC ........... H01L 21/02414; H01L 21/0241; H01L 33/424
USPC .... 257/472, 485, 613; 438/46, 85, 104, 168, 438/478
See application file for complete search history.

(56) References Cited

U.S. PATENT DOCUMENTS

| | | |
|---|---|---|
| 2006/0150891 A1 | 7/2006 | Ichinose et al. |
| 2007/0134833 A1 | 6/2007 | Ikemoto et al. |
| 2007/0166967 A1 | 7/2007 | Ichinose et al. |
| 2008/0265264 A1 | 10/2008 | Ichinose et al. |
| 2010/0229789 A1 | 9/2010 | Ichinose et al. |
| 2012/0304918 A1 | 12/2012 | Ichinose et al. |
| 2014/0048823 A1 | 2/2014 | Sato et al. |
| 2016/0149005 A1* | 5/2016 | Oda ...................... C30B 25/183 252/519.1 |

FOREIGN PATENT DOCUMENTS

| | | |
|---|---|---|
| JP | 2004-262684 A | 9/2004 |
| JP | 2004-342857 A | 12/2004 |
| JP | 2005-235961 A | 9/2005 |
| JP | 2008-156141 A | 7/2008 |
| JP | 2010-010572 A | 1/2010 |
| JP | 2011-146652 A | 7/2011 |
| WO | WO 2012/137781 A1 | 10/2012 |

OTHER PUBLICATIONS

International Search Report dated Sep. 11, 2012 in PCT/JP2012/069975 (English version).
United States Office Action dated Mar. 4, 2015 in U.S. Appl. No. 14/343,028.
United States Notice of Allowance dated May 22, 2015 in U.S. Appl. No. 14/343,028.
United States Office Action dated Oct. 24, 2014 in U.S. Appl. No. 14/343,028.
European Search Report dated Jan. 27, 2015.
Japanese Office Action, dated May 10, 2016, with a partial English translation.
Japanese Office Action, dated Oct. 4, 2016, with a partial English translation.

* cited by examiner

SUBSTRATE FOR EPITAXIAL GROWTH, AND CRYSTAL LAMINATE STRUCTURE

The present application is a Continuation Application of U.S. patent application Ser. No. 14/343,028, filed on Mar. 5, 2014, which is based on International Application No. PCT/JP2012/069975, filed on Aug. 6, 2012, which is based on the Japanese Patent Application No. 2011-196429, filed on Sep. 8, 2011, the entire contents of which are incorporated herein by reference.

TECHNICAL FIELD

The invention relates to an epitaxial growth substrate (or substrate for epitaxial growth) and, in particular, to an epitaxial growth substrate that includes a P-$Ga_2O_3$-based single crystal and a crystal laminate structure (or laminated crystal structure).

BACKGROUND ART

A semiconductor element is known in which a Ga-containing oxide is deposited on an element substrate formed of a P-$Ga_2O_3$-based single crystal (see, e.g., PTL 1).

This type of semiconductor element is formed by laminating a layer of n-type or p-type conductivity on a main surface of a P-$Ga_2O_3$ single crystal substrate using a physical vapor-phase growth method such as MBE (Molecular Beam Epitaxy) or a chemical vapor-phase growth method such as CVD (Chemical Vapor Deposition).

In addition, a (100) plane having high cleavability and thus providing a flat surface easily is used as the main surface of the P-$Ga_2O_3$ single crystal substrate (see, e.g., PTL 2).

CITATION LIST

Patent Literature

[PTL 1]
JP-A-2005-235961 [PTL 2]
JP-A-2008-156141

SUMMARY OF INVENTION

Technical Problem

Recently, for further improvement in performance of semiconductor elements, the challenge is how to form a steep interface between the element substrate and an epitaxial layer formed thereon and between laminated epitaxial layers and how to form an epitaxial layer with a highly accurate thickness.

It is an object of the invention to provide an epitaxial growth substrate that allows an improvement in the crystalline quality of a Ga-containing oxide layer formed on the β-$Ga_2O_3$ single crystal substrate, as well as a crystal laminate structure.

Solution to Problem

The present inventors have conducted researches for achieving the above object and found that the crystalline quality of the Ga-containing oxide layer formed on the β-$Ga_2O_3$ single crystal substrate depends on which crystal surface of the β-$Ga_2O_3$ single crystal substrate is used as the main surface. Then, the present invention has been completed by repeating further experiments.

The present invention is based on findings obtained by the experiments and offers the epitaxial growth substrate and the crystal laminate structure below.

[1] An epitaxial growth substrate, comprising:
  a β-$Ga_2O_3$-based single crystal; and
  a (010) plane or a plane inclined at an angle not more than 37.5° with respect to the (010) plane as a main surface thereof.

[2] The epitaxial growth substrate according to [1], wherein the main surface comprises a (010) plane or a plane between the (010) plane and a (310) plane of the β-$Ga_2O_3$-based single crystal.

[3] The epitaxial growth substrate according to [2], wherein the main surface comprises the (010) plane or the (310) plane of the β-$Ga_2O_3$-based single crystal.

[4] A crystal laminate structure, comprising:
  an epitaxial growth substrate comprising β-$Ga_2O_3$-based single crystal and a (010) plane or a plane inclined at an angle not more than 37.5° with respect to the (010) plane as a main surface thereof; and
  an epitaxial crystal formed on the main surface of the epitaxial growth substrate and comprising a Ga-containing oxide.

[5] The crystal laminate structure according to [4], wherein the main surface comprises a (010) plane or a plane between the (010) plane and a (310) plane of the β-$Ga_2O_3$-based single crystal.

[6] The crystal laminate structure according to [5], wherein the main surface comprises the (010) plane or the (310) plane of the β-$Ga_2O_3$-based single crystal.

Advantageous Effects of Invention

According to an embodiment of the invention, the crystalline quality of the Ga-containing oxide layer formed on the β-$Ga_2O_3$ single crystal substrate can be improved.

DESCRIPTION OF EMBODIMENTS

Figure 1A:
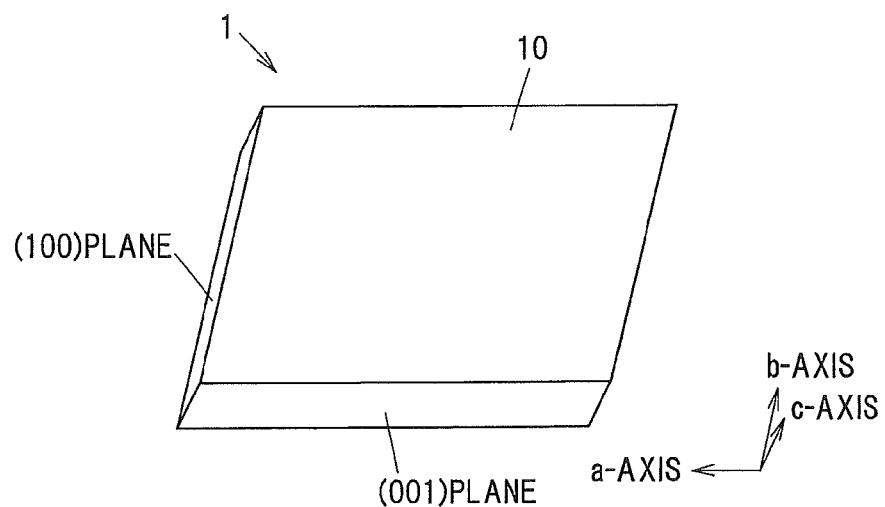
FIG. 1A is a perspective view showing an epitaxial growth substrate in a first embodiment.

FIG. 1A is a perspective view showing an epitaxial growth substrate in the first embodiment of the invention. This epitaxial growth substrate 1 is formed of a $\beta$-$Ga_2O_3$ (gallium oxide)-based single crystal and has a (010) plane as a main surface 10.

The epitaxial growth substrate 1 is formed in a plate shape having predetermined plane orientations. Orientation axes of the $\beta$-$Ga_2O_3$ crystal structure includes an a-axis <100>, a b-axis <010> and a c-axis <001>, and the epitaxial growth substrate 1 is formed in a plate shape having the predetermined plane orientations defined by these three axes, i.e., a (010) plane, a (100) plane and a (001) plane. Of those, the (010) plane is the main surface 10 used for epitaxially growing a crystal of Ga-containing oxide when manufacturing a semiconductor element and is formed so as to have a larger area than other planes.

Figure 1B:
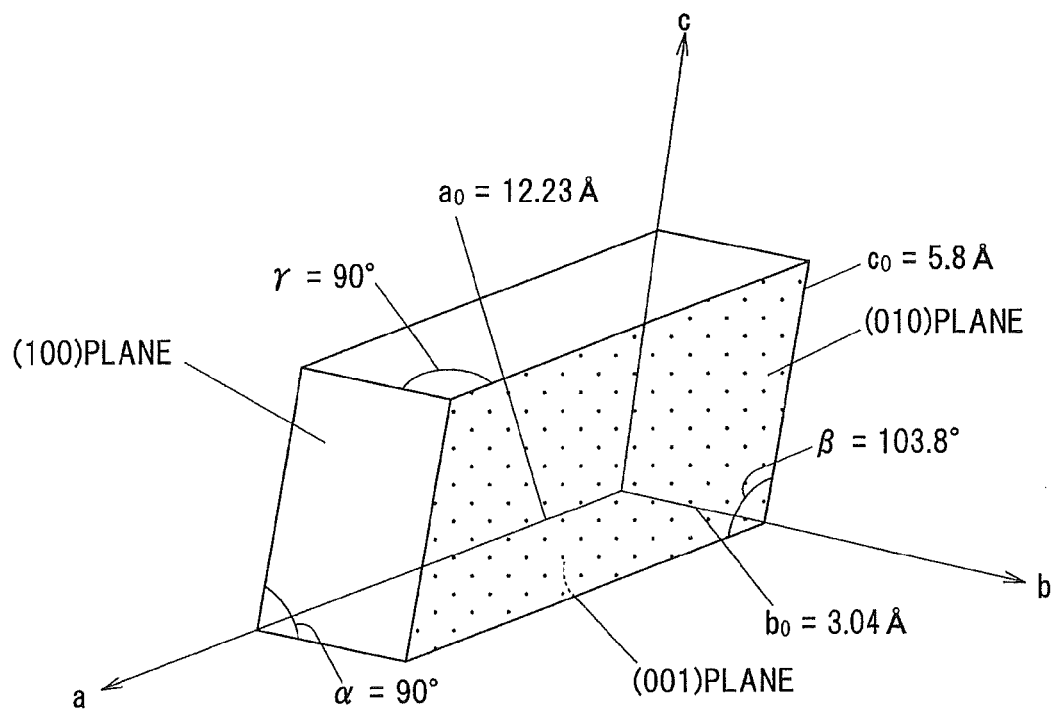
FIG. 1B is a sterical view showing a crystal structure by which the plane orientation of the epitaxial growth substrate of FIG. 1A is defined.

FIG. 1B is a sterical view showing a crystal structure in which plane orientations of the epitaxial growth substrate of FIG. 1A are defined. $\beta$-$Ga_2O_3$ is a monoclinic crystal and is formed so that α=γ=90°, β=103.8°, a-axis lattice constant ($a_0$)=12.23 Å, b-axis lattice constant ($b_0$)=3.04 Å and c-axis lattice constant ($c_0$)=5.8 Å.

It should be noted that, the epitaxial growth substrate 1 is basically formed of a $\beta$-$Ga_2O_3$ single crystal as described above but may be formed of an oxide including mainly Ga doped with one or more elements selected from the three consisting of Cu, Ag, Zn, Cd, Al, In, Si, Ge and Sn. It is possible to control a lattice constant, bandgap energy or electrical conduction properties by adding such elements. When adding, e.g., elements of Al and In, it is possible to obtain the epitaxial growth substrate 1 represented by $(Ga_x Al_y In_{(1-x-y)})_2O_3$ (where 0<x≤1, 0≤y≤1, 0<x+y≤1). The band gap is widened by adding Al and is narrowed by adding In. (Method of Manufacturing Epitaxial Growth Substrate 1)

For manufacturing the epitaxial growth substrate 1, a bulk crystal is firstly made by the FZ (Floating Zone) method or the EFG (Edge Defined Film Fed Growth) method, etc., and is then cut out and formed into a plate shape by cutting or cleaving.

In case of using the FZ method, a bulk crystal is formed using, e.g., an infrared-heating single crystal manufacturing system. In detail, firstly, an end of a seed crystal is held on a seed chuck and an upper end portion of a rod-like polycrystalline raw material is held on a raw-material chuck. After adjusting a vertical position of an upper rotating shaft, the top edge of the seed crystal is brought into contact with the lower edge of the polycrystalline raw material. The vertical position of the upper rotating shaft and that of a lower rotating shaft are adjusted so that light of halogen lamp is focused on the upper edge of the seed crystal and the lower edge of the polycrystalline raw material. After the adjustment, the upper edge of the seed crystal and the lower edge of the polycrystalline raw material are heated the heated portion is melted, thereby forming melt droplets. At this time, only the seed crystal is being rotated. The aforementioned portion is melted while rotating the polycrystalline raw material and the seed crystal in opposite directions so as to be mixed sufficiently and the polycrystalline raw material and the seed crystal are then pulled in directions opposite to each other to form a single crystal having appropriate length and thickness, thereby making a bulk crystal.

In case of using the EFG method, a predetermined amount of $\beta$-$Ga_2O_3$ to be a raw material is put in a crucible and is melted by heating, thereby forming $\beta$-$Ga_2O_3$ melt. Through a slit formed on a slit die which is placed in the crucible, the $\beta$-$Ga_2O_3$ melt is drawn up to an upper surface of the slit die by capillary action, the $\beta$-$Ga_2O_3$ melt is cooled by contact with the seed crystal and a bulk crystal having an arbitrary cross sectional shape is thereby formed.

It should be noted that, the $\beta$-$Ga_2O_3$ bulk crystals made by these methods may be doped with impurities for the purpose of obtaining a desired conductivity type.

The $\beta$-$Ga_2O_3$ bulk crystal formed as described above is shaped by, e.g., a wire saw so that the (010) plane is exposed as a main surface, thereby obtaining thin sheet-like $\beta$-$Ga_2O_3$ having a desired shape with a thickness of, e.g., 1 mm. After grinding and polishing until the thickness becomes about 600 μm, the epitaxial growth substrate 1 is obtained.

Subsequently, the epitaxial growth substrate 1 is subjected to organic cleaning in order of methanol, acetone and methanol for three minutes each and is further subjected to running water cleaning using ultrapure water, hydrofluoric acid immersion cleaning for fifteen minutes, sulfuric acid/ hydrogen peroxide mixture immersion cleaning for five minutes and then running water cleaning using ultrapure water. After the subsequent thermal cleaning at 800° C. for ten minutes, the main surface of the epitaxial growth substrate 1 is ready for epitaxial growth of a Ga-containing oxide.

(Crystal Laminate Structure and Forming Method Thereof)

Next, a crystal laminate structure and a forming method thereof in the present embodiment will be described in reference to FIGS. 2 and 3.

Figure 2:
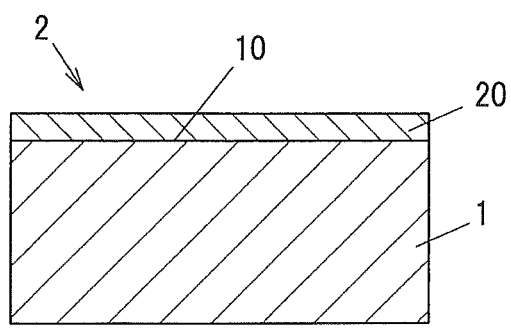
FIG. 2 is a cross sectional view showing an example structure of a crystal laminate structure.

FIG. 2 is a cross sectional view showing an example structure of a crystal laminate structure in the present embodiment. A crystal laminate structure 2 is formed by laminating an epitaxial crystal 20 made of a Ga-containing oxide on the main surface 10 of the epitaxial growth substrate 1 described above.

The epitaxial crystal 20 is a crystalline body having, e.g., a β-Gallia structure containing Ga, and in more detail, is a crystalline body including mainly $Ga_2O_3$ or a mixed crystalline body-containing $Ga_2O_3$ and more than 0 wt % and not more than 60 wt % of $Al_2O_3$ in the form of a crystal layer mainly having a β-Gallia structure. In addition, an impurity determining a conductivity type may be added to the epitaxial crystal 20.

The method of forming the epitaxial crystal 20 on the main surface 10 of the epitaxial growth substrate 1 is, e.g., PLD (Pulsed Laser Deposition), CVD (Chemical Vapor Deposition), sputtering and MBE (Molecular Beam Epitaxy) etc. In the present embodiment, a thin film growth method using the MBE is employed. The MBE is a crystal growth method in which a single or compound solid is heated in an evaporation source called cell and vapor generated by heat is supplied as a molecular beam onto the surface of the substrate.

Figure 3:
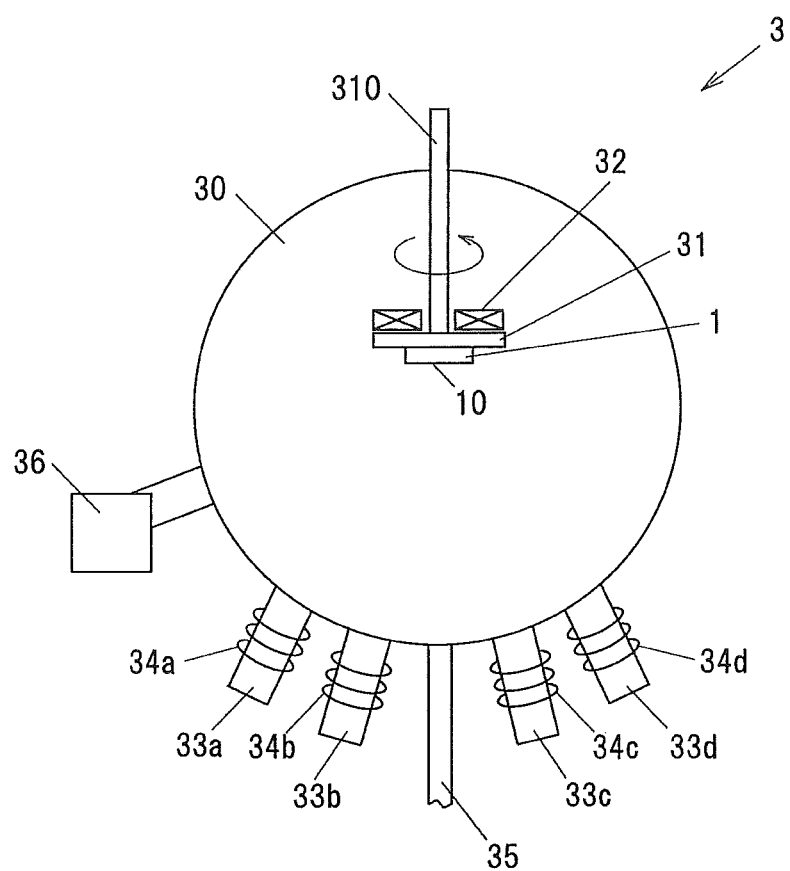
FIG. 3 is a cross sectional view showing an MBE system used for forming the crystal laminate structure.

FIG. 3 is a cross sectional view showing an MBE system used for forming the crystal laminate structure 2. An MBE system 3 is provided with a vacuum chamber 30, a substrate holder 31 supported in the vacuum chamber 30 to hold the epitaxial growth substrate 1, heating devices 32 held on the substrate holder 31, plural cells 33 (33a, 33b, 33c, 33d) each provided for each atom or molecule constituting the epitaxial crystal 20, heaters 34 (34a, 34b, 34c, 34d) for hearing the plural cells 33, a gas supply pipe 35 for supplying oxygen gas into the vacuum chamber 30, and a vacuum pump 36 for exhausting the air in the vacuum chamber 30. It is configured that the substrate holder 31 can be rotated by a non-illustrated motor via a shaft 310.

Ga to be a material of the epitaxial crystal 20 is loaded in the first cell 33a. Al also to be a material of the epitaxial crystal 20 is loaded in the second cell 33b. Meanwhile, a material to be doped as a donor, such as Si or Sn, is loaded in the third cell 33c. A material to be doped as an acceptor, such as Mg or Zn, is loaded in the fourth cell 33d. Each of the first to fourth cells 33a to 33d is provided with a non-illustrated shutter and is configured to be closed by the shutter when not necessary.

Next, a manufacturing procedure of the crystal laminate structure 2 will be described. Firstly, the epitaxial growth substrate 1 is attached to the substrate holder 31 of the MBE system 3. Next, the vacuum pump 36 is activated to reduce atmospheric pressure in the vacuum chamber 30 to about $10^{-10}$ Torr. Then, the epitaxial growth substrate 1 is heated by the heating devices 32.

After the epitaxial growth substrate 1 is heated to a predetermined temperature, oxygen gas produced by a non-illustrated oxygen generator is supplied into the vacuum chamber 30 through the gas supply pipe 35.

In case of making a crystal formed of $Ga_2O_3$ as the epitaxial crystal 20, the first heater 34a of the first cell 33a is heated while rotating the substrate holder 31 after supplying the oxygen gas into the vacuum chamber 30 so that Ga vapor is started to be supplied. Meanwhile, in case of making a mixed crystal of $Ga_2O_3$ and $Al_2O_3$ as the epitaxial crystal 20, the first heater 34a of the first cell 33a and the second heater 34b of the second cell 33b are heated while rotating the substrate holder 31 so that Ga vapor and Al vapor are started to be supplied.

Growth conditions of the epitaxial crystal 20 in case of making a crystal formed of $Ga_2O_3$ as the epitaxial crystal 20 are, e.g., a growth temperature of 700° C., Ga beam-equivalent pressure (BEP) of $3\times10^{-5}$ Pa and growth time of 1 hour. Meanwhile, in case of making a mixed crystal of $Ga_2O_3$ and $Al_2O_3$ as the epitaxial crystal 20, some of the above-mentioned growth conditions can be such that the Ga beam-equivalent pressure is $1.5\times10^{-5}$ Pa and Al beam-equivalent pressure is, e.g., $5\times10^{-7}$ Pa.

Accordingly, the epitaxial crystal 20 formed of a Ga-containing oxide is grown on the main surface 10 of the epitaxial growth substrate 1 and the crystal laminate structure 2 is thereby obtained.

Meanwhile, when imparting an n-type conductivity to the epitaxial crystal 20, the material to be a donor such as Si or Sn is supplied from the third cell 33c by heating the third heater 34c. On the other hand, when imparting a p-type conductivity, the material to be an acceptor such as Mg or Zn is supplied from the fourth cell 33d by heating the fourth heater 34d.

(Analysis of Crystal Laminate Structure)

Figure 4A:
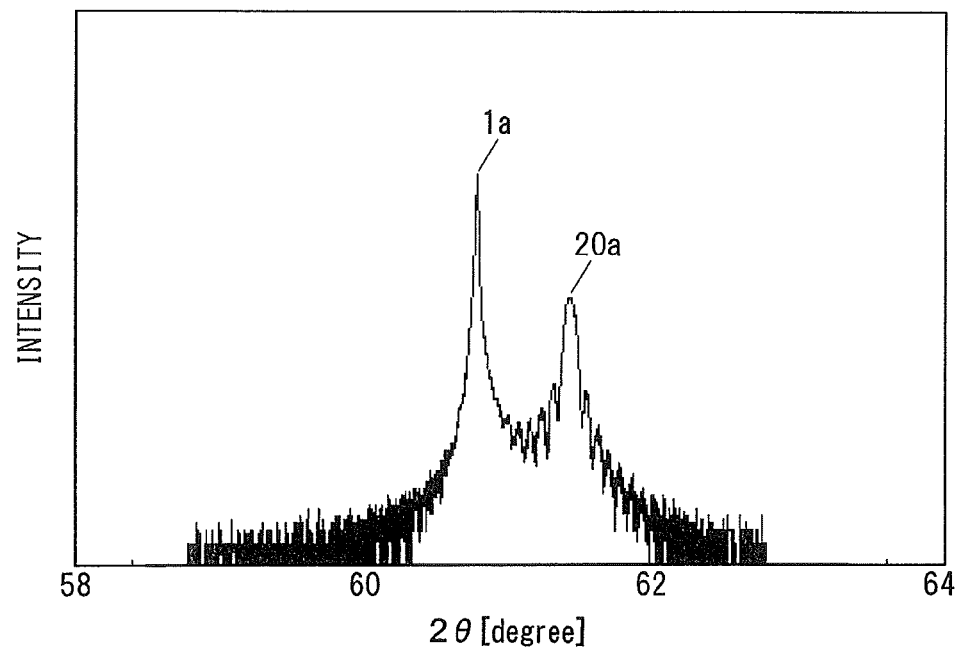
FIG. 4A is an XRD 2θ-θ spectrum showing an X-ray diffraction measurement result of the crystal laminate structure when only one $(AlGa)_2O_3$ layer with an Al content of 20% is epitaxially grown on the epitaxial growth substrate.

FIG. 4A is an XRD (X-ray diffraction) 2θ-θ spectrum showing an X-ray diffraction measurement result of the crystal laminate structure 2 having the epitaxial crystal 20 which is manufactured by the method mentioned above so as to be constructed from one β-$(AlGa)_2O_3$ layer with the Al content of 20%. A vertical axis of this graph shows X-ray scattering intensity expressed in logarithm. This graph shows a peak 1a due to the epitaxial growth substrate 1 and a sharp peak 20a due to the epitaxial crystal 20. In addition, a clear fringe is seen between the peak 1a and the peak 20a. Based on this clear fringe pattern, it is confirmed that a crystal laminate structure having a steep interface is formed.

Figure 4B:
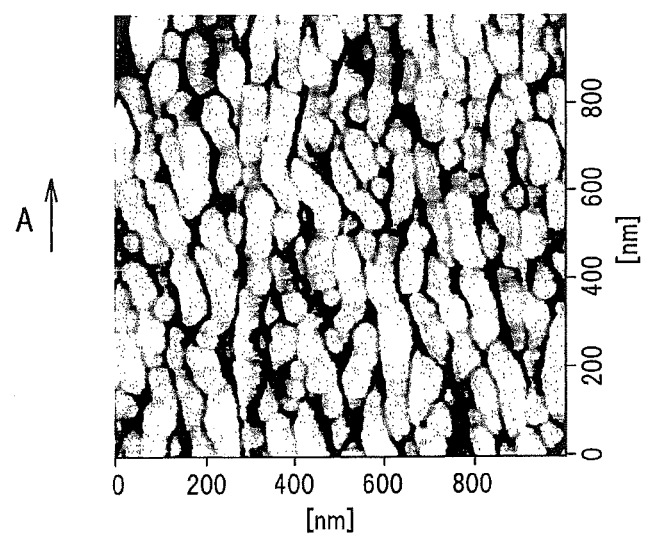
FIG. 4B is an atomic force microscope image showing a surface state of an epitaxial crystal.

FIG. 4B is an atomic force microscope image showing a surface state of the epitaxial crystal 20 which is manufactured by the method mentioned above so as to be constructed from one β-$(AlGa)_2O_3$ layer with the Al content of 20%. An arrow-A in the drawing indicates a [100] direction of the epitaxial growth substrate 1. It is confirmed from this image that the epitaxial crystal 20 grows in a direction vertical or nearly vertical to the main surface 10 (the (010) plane) of the epitaxial growth substrate 1.

Figure 5A:
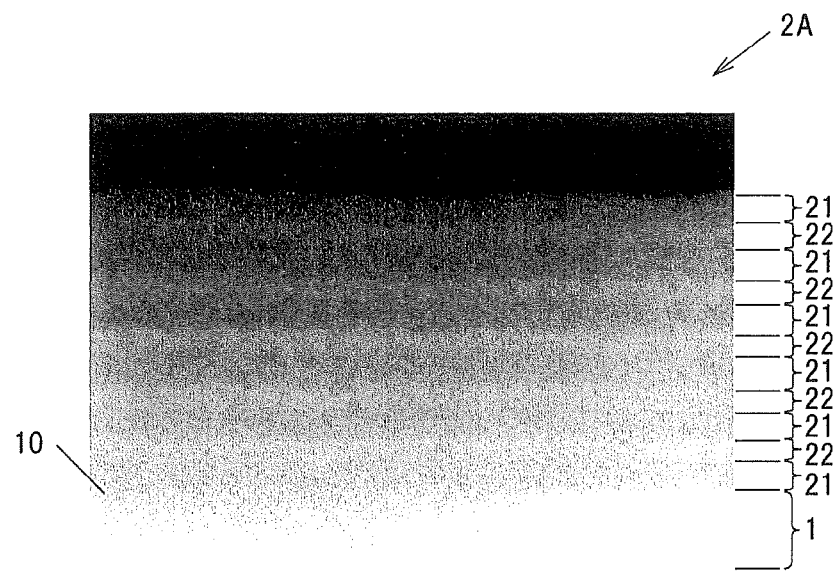
FIG. 5A is a TEM observation image of a crystal laminate structure in which plural $(AlGa)_2O_3$ layers and $Ga_2O_3$ layers are alternately formed.

FIG. 5A is a Transmission Electron Microscope (TEM) observation image of a crystal laminate structure 2A in which plural $(AlGa)_2O_3$ layers 21 and plural $Ga_2O_3$ layers 22 are alternately formed by epitaxial growth on the main surface 10 of the epitaxial growth substrate 1. The shutters of the first cell 33a and the second cell 33b of the MBE system 3 are opened and closed to adjust the thicknesses of the $(AlGa)_2O_3$ layers 21 and the $Ga_2O_3$ layers 22 to predetermined thicknesses as well as to alternately laminate each layer, thereby forming the crystal laminate structure 2A.

As shown in the TEM observation image, the crystal laminate structure 2A has six 6 nm-thick $(AlGa)_2O_3$ layers 21 and five 4 nm-thick $Ga_2O_3$ layers 22 which are alternately laminated on the epitaxial growth substrate 1. The $(AlGa)_2O_3$ layers 21 and the $Ga_2O_3$ layers 22 appeared in a stripe pattern can clearly observed and it is thus understood that the layers having steep interface are formed with a highly accurate film thickness.

Figure 5B:
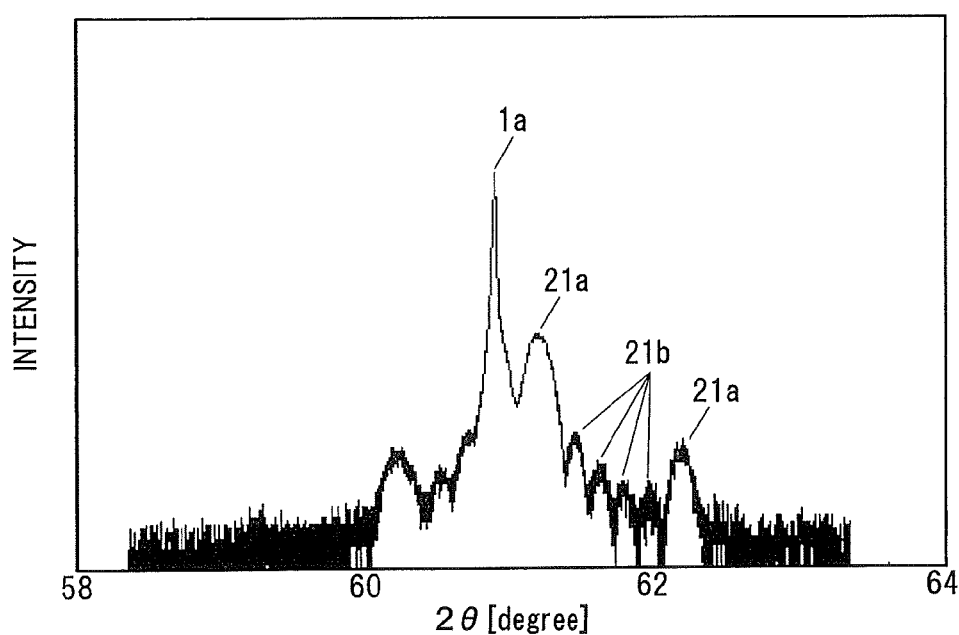
FIG. 5B is an XRD 2θ-θ spectrum of the crystal laminate structure.

FIG. 5B is a graph of XRD 2θ-θ spectrum showing the X-ray diffraction measurement result of the crystal laminate structure 2A shown in FIG. 5A. This graph clearly shows the peak 1a due to the epitaxial growth substrate 1, plural satellite peaks 21a due to the plural $(AlGa)_2O_3$ layers 21 and plural fringes 21b therebetween and it is confirmed also from the X-ray diffraction measurement result that a crystal laminate structure having a steep interface is formed.

Comparative Examples

Figure 6A:
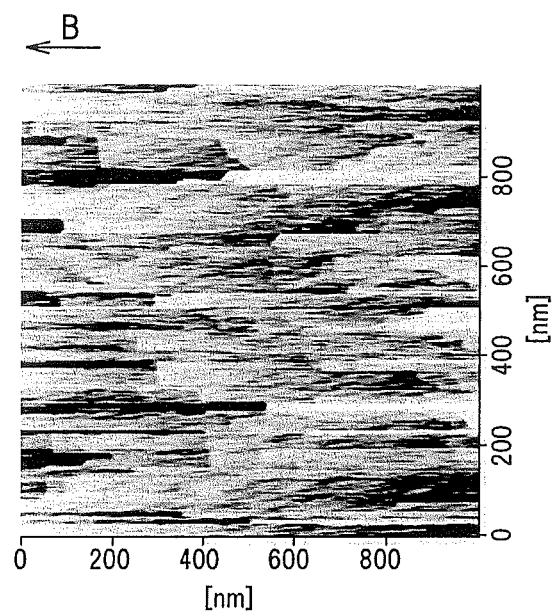
FIG. 6A is an atomic force microscope image showing a surface state of an epitaxial crystal which is shown as a Comparative Example and is grown so as to have a (100) plane as a main surface.
Figure 6B:
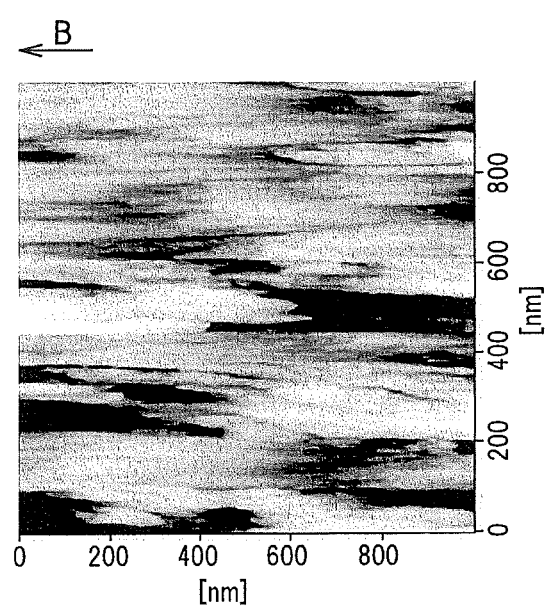
FIG. 6B is an atomic force microscope image showing a surface state of an epitaxial crystal which is shown as a Comparative Example and is grown so as to have a (001) plane as a main surface.

FIG. 6 are atomic force microscope images each showing a surface state of an epitaxial crystal as Comparative Example in case that an epitaxial crystal formed of β-Ga$_2$O$_3$ is grown by the same manufacturing method as mentioned above on the (100) plane or the (001) plane as the main surface of a β-Ga$_2$O$_3$-based single crystal substrate, wherein FIG. 6A shows a surface state when the (100) plane is the main surface and FIG. 6B shows a surface state when the (001) plane is the main surface. An arrow-B in FIG. 6A and FIG. 6B indicates a [010] direction of the substrate.

As shown in FIG. 6A and FIG. 6B, it is understood that needle-shaped crystals are grown in the [010] direction so as to be stacked in a direction vertical to the (100) plane or the (001) plane as the main surface in these Comparative Examples. This is considered a phenomenon caused because the growth rate in the [010] direction is faster than that in the [100] direction or the [001] direction.

The present inventors have also confirmed that, when elements other than Ga and O (e.g., Al, In, Si, Sn, Mg, Zn, etc.) are added while using the (100) plane or the (001) plane as the main surface, such elements are unevenly distributed at a portion of the epitaxial crystal since a relation between the substrate plane orientation and the growth rate is different depending on elements and a homogeneous epitaxial crystal thus cannot be obtained.

Figure 7A:
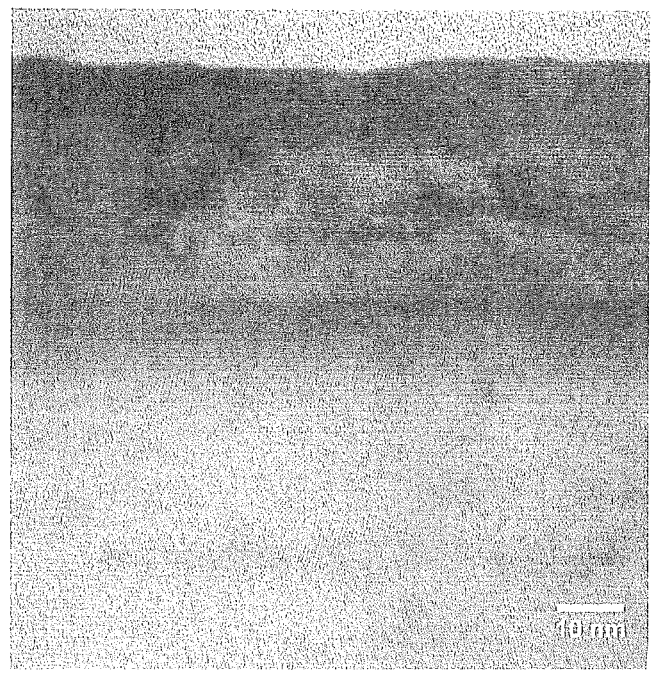
FIG. 7A is a TEM observation image of a crystal laminate structure in which plural $(AlGa)_2O_3$ layers and $Ga_2O_3$ layers are alternately formed on an epitaxial growth substrate formed of a $\beta$-$Ga_2O_3$-based single crystal having a (100) plane as a main surface.
Figure 7B:
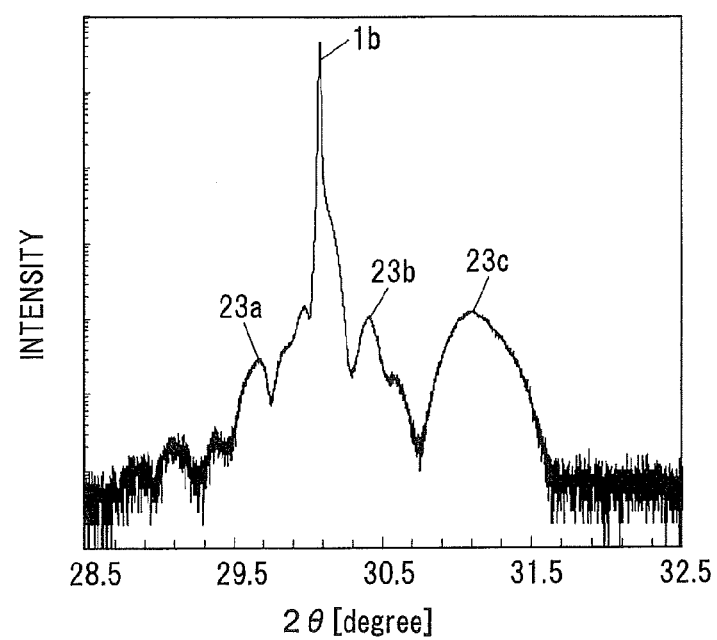
FIG. 7B is an XRD 2θ-θ spectrum of the crystal laminate structure of FIG. 7A.

FIG. 7A is a transmission electron microscope observation image of a crystal laminate structure when plural (Al$_{1-x}$Ga$_x$)$_2$O$_3$ layers (x=0.6) and plural Ga$_2$O$_3$ layers are alternately formed by epitaxial growth using the MBE system 3 on an epitaxial growth substrate formed of a β-Ga$_2$O$_3$-based single crystal having a (100) plane as a main surface. Meanwhile, FIG. 7B is a graph of XRD 2θ-θ spectrum showing the X-ray diffraction measurement result of the crystal laminate structure shown in FIG. 7A.

As shown in FIG. 7A, in this crystal laminate structure, an interface between the (Al$_{1-x}$Ga$_x$)$_2$O$_3$ layer and the Ga$_2$O$_3$ layer is unclear and a stripe pattern such as shown in FIG. 5A is not observed. Meanwhile, the XRD 2θ-θ spectrum in FIG. 7B shows a peak 1b due to diffraction from β-Ga$_2$O$_3$ (400) plane of the epitaxial growth substrate and plural peaks 23a to 23c which are observed therearound and are considered to be derived from the crystal laminate structure composed of the (Al$_{1-x}$Ga$_x$)$_2$O$_3$ layers and the Ga$_2$O$_3$ layers. However, there is no periodicity in the intervals of these peaks and it is thus considered that a good laminate structure cannot be formed.

Effects of the First Embodiment

In the first embodiment, since the main surface 10 is the (010) plane of the epitaxial growth substrate 1 formed of a β-Ga$_2$O$_3$-based single crystal, it is possible to provide a steep interface between the main surface 10 and the epitaxial crystal 20 formed thereon made of a Ga-containing oxide and it is also possible to form the epitaxial crystal 20 with a highly accurate thickness. In addition, it is possible to homogenize the epitaxial crystal 20 by suppressing unevenness in an amount of element incorporated thereinto.

Modification of the First Embodiment

Next, a modification of the first embodiment of the invention will be described in reference to FIG. 8.

Figure 8A:
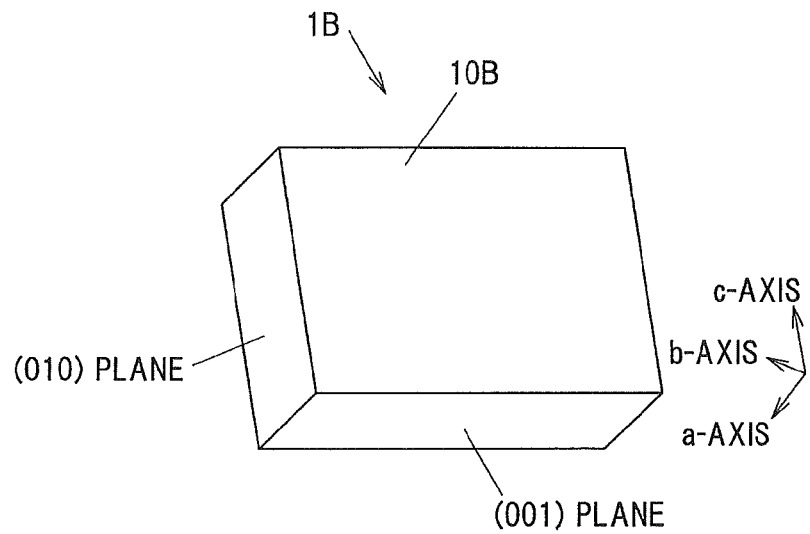
FIG. 8A is a perspective view showing an epitaxial growth substrate in a modification of the first embodiment.

FIG. 8A is a perspective view showing an epitaxial growth substrate 1B in the modification of the first embodiment. The epitaxial growth substrate 1B is formed of a β-Ga$_2$O$_3$-based single crystal in the same manner as the above-mentioned epitaxial growth substrate 1 but is different from the above-mentioned epitaxial growth substrate 1 in that a (310) plane is a main surface 10B.

Figure 8B:
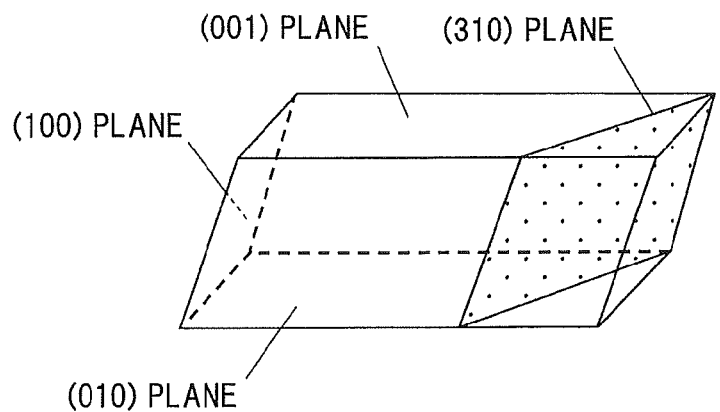
FIG. 8B is a sterical view showing a (310) plane of the $\beta$-$Ga_2O_3$-based single crystal.
Figure 8C:
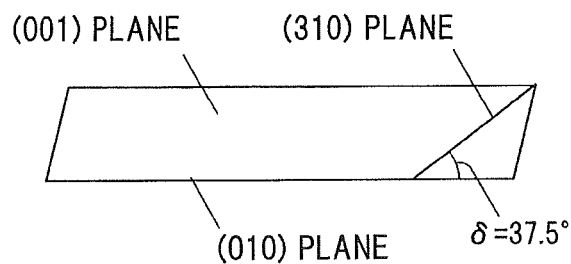
FIG. 8C is a diagram illustrating an angle δ defined between the (310) plane and the (010) plane of the $\beta$-$Ga_2O_3$-based single crystal.

FIG. 8B is a sterical view showing the (310) plane of the β-Ga$_2$O$_3$-based single crystal. Meanwhile, FIG. 8C is a diagram illustrating an angle δ formed between the (310) plane and the (010) plane of the β-Ga$_2$O$_3$-based single crystal. As shown in these drawings, the (310) plane of the β-Ga$_2$O$_3$-based single crystal is a plane which is inclined at an angle δ=37.5° with respect to the (010) plane.

It is possible to obtain a crystal laminate structure by forming the epitaxial crystal 20 on the main surface 10B (the (310) plane) of this epitaxial growth substrate 1B using the same method as described above.

Figure 9:
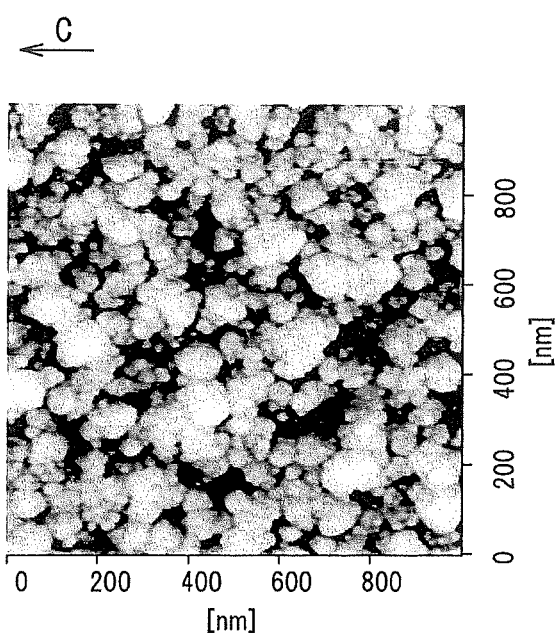
FIG. 9 is an atomic force microscope image obtained when observing a surface of an epitaxial crystal formed on the (310) plane of the epitaxial growth substrate.

FIG. 9 is an atomic force microscope image when observing a surface of the epitaxial crystal 20 which is formed on the main surface 10B of the epitaxial growth substrate 1B using the method described above. An arrow-C in the drawing indicates a c-axis direction.

As shown in this drawing, the epitaxial crystal 20 does not grow in a needle shape but is formed to extend in a direction crossing the main surface 10B.

Also in case of using this epitaxial growth substrate 1B, it is possible to obtain a crystal laminate structure which has a steep interface and allows the epitaxial crystal 20 to be formed with a highly accurate thickness. In addition, it is possible to homogenize the epitaxial crystal 20 by suppressing unevenness in an amount of element incorporated thereinto. In other words, it is possible to achieve the same effects as those described in the first embodiment even by the epitaxial growth substrate of which main surface is a plane inclined at an angle equal to or smaller than 37.5° with respect to the (010) plane.

Second Embodiment

Figure 10:
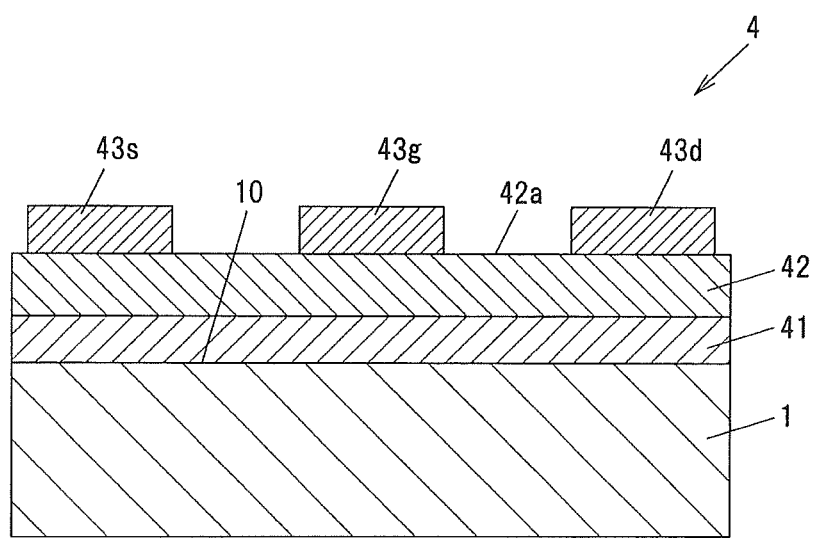
FIG. 10 is a cross sectional view showing an example structure of a high-electron-mobility transistor in a second embodiment of the present invention.

Next, the second embodiment of the invention will be described in reference to FIG. 10. FIG. 10 is a cross sectional view showing an example structure of a high-electron-mobility transistor (HEMT) which is an example of the semiconductor device in the present embodiment.

In this high-electron-mobility transistor 4, the epitaxial growth substrate 1 in the first embodiment is provided as an element substrate and an i-type β-(AlGa)$_2$O$_3$ layer 41 as a first Ga-containing oxide layer and an n-type β-(AlGa)$_2$O$_3$ layer 42 as a second Ga-containing oxide layer are laminated by epitaxial growth on the main surface 10 of the epitaxial growth substrate 1. In addition, a gate electrode 43g, a source electrode 43s and a drain electrode 43d are provided on the n-type β-(AlGa)$_2$O$_3$ layer 42.

The gate electrode 43g is in contact with a surface 42a of the n-type β-(AlGa)$_2$O$_3$ layer 42, thereby forming a Schottky junction. Meanwhile, the source electrode 43s and the drain electrode 43d are arranged with the gate electrode 43g interposed therebetween and are in ohmic contact with the surface 42a of the n-type β-(AlGa)$_2$O$_3$ layer 42.

While the β-(AlGa)$_2$O$_3$ single crystal generally has an n-type conductivity due to oxygen defects, the epitaxial growth substrate 1 in the second embodiment is doped with a predetermined amount of group II elements such as Mg and is thus formed to have high resistance.

The i-type β-(AlGa)$_2$O$_3$ layer 41 is an undoped electron transit layer and is formed by epitaxial growth on the main surface 10 of the epitaxial growth substrate 1. It is possible to form the i-type β-(AlGa)$_2$O$_3$ layer 41 by mixing, e.g., not less than 5 percent by weight of ozone to the oxygen gas supplied from the gas supply pipe 35.

The n-type β-(AlGa)$_2$O$_3$ layer 42 is an electron supply layer doped with a donor such as Si or Sn and is formed by epitaxial growth on the i-type β-(AlGa)$_2$O$_3$ layer 41.

Since the i-type β-(AlGa)$_2$O$_3$ layer 41 and the n-type β-(AlGa)$_2$O$_3$ layer 42 have different band gaps, discontinuity of bands occurs at the interface therebetween, electrons generated from the donor in the n-type β-(AlGa)$_2$O$_3$ layer 42 are concentrated on the i-type β-(AlGa)$_2$O$_3$ layer 41 side and are distributed in a region in the vicinity of the interface, and an electron layer called two-dimensional electron gas is thereby formed.

As such, a first depletion layer due to the Schottky junction of the gate electrode 43g and a second depletion layer due to the formation of two-dimensional electron gas are produced in the n-type β-(AlGa)$_2$O$_3$ layer 42. The n-type β-(AlGa)$_2$O$_3$ layer 42 is formed in a thickness at which the first depletion layer is in contact with the second depletion layer.

Voltage is applied to the gate electrode 43g to change the thicknesses of the first and second depletion layers and to adjust the concentration of the two-dimensional electron gas, thereby allowing drain current to be controlled.

The thickness of the i-type β-(AlGa)$_2$O$_3$ layer 41 is not specifically limited but is desirably not less than 0.1 nm. In addition, the thickness of the n-type β-(AlGa)$_2$O$_3$ layer 42 is set to 0.1 nm to 10 μm depending on a doping concentration.

Effects of the Second Embodiment

In the second embodiment, the i-type β-(AlGa)$_2$O$_3$ layer 41 having a steep interface with a highly accurate thickness can be formed on the main surface 10 which is the (010) plane of the β-Ga$_2$O$_3$-based single crystal constituting the epitaxial growth substrate 1 and, as a result, it is possible to provide a steep interface between the i-type β-(AlGa)$_2$O$_3$ layer 41 and the n-type β-(AlGa)$_2$O$_3$ layer 42. In addition, it is possible to form the n-type β-(AlGa)$_2$O$_3$ layer 42 with a highly accurate thickness. It is therefore possible to produce the high-electron-mobility transistor 4 with high performance and stable quality.

Third Embodiment

Figure 11:
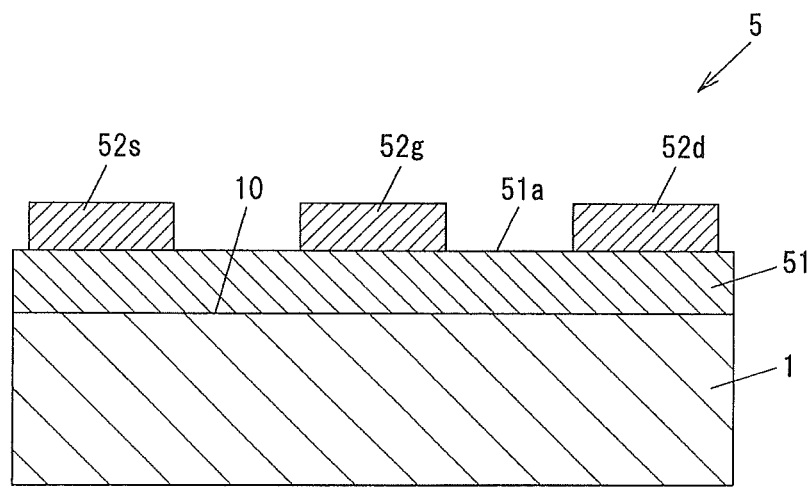
FIG. 11 is a cross sectional view showing an example structure of a MESFET in a third embodiment of the invention.

Next, the third embodiment of the invention will be described in reference to FIG. 11. FIG. 11 is a cross sectional view showing an example structure of a MESFET (Metal-Semiconductor Field Effect Transistor) which is one type of field-effect transistors and is another example of the semiconductor device in the present embodiment.

In this MESFET 5, the epitaxial growth substrate 1 in the first embodiment is provided as an element substrate and an n-type β-Ga$_2$O$_3$ layer 51 formed by epitaxial growth is provided on the main surface 10 (the (010) plane) of the epitaxial growth substrate 1. In addition, a gate electrode 52g, a source electrode 52s and a drain electrode 52d are provided on the n-type β-Ga$_2$O$_3$ layer 51.

The gate electrode 52g is in contact with a surface 51a of the n-type β-Ga$_2$O$_3$ layer 51, thereby forming a Schottky junction. Meanwhile, the source electrode 52s and the drain electrode 52d are arranged with the gate electrode 52g interposed therebetween and are in ohmic contact with the surface 51a of the n-type β-Ga$_2$O$_3$ layer 51.

In the n-type β-Ga$_2$O$_3$ layer 51, the donor concentration is high in the vicinity of contact areas with the source electrode 52s and with the drain electrode 52d because of addition of Si or Sn, etc. Meanwhile, the donor concentration in the other region including a contact area with the gate electrode 52g is lower than in the vicinity of the contact areas with the source electrode 52s and with the drain electrode 52d.

The epitaxial growth substrate 1 in the third embodiment is doped with a predetermined amount of group II elements such as Mg and is thus formed to have high resistance.

In the MESFET 5 configured as described above, the thickness of the depletion layer in the n-type β-Ga$_2$O$_3$ layer 51 is changed by adjusting bias voltage applied to the gate electrode 52g, thereby allowing drain current to be controlled.

Effects of the Third Embodiment

In the third embodiment, the n-type β-Ga$_2$O$_3$ layer 51 having a steep interface a highly accurate thickness can be formed on the main surface 10 which is the (010) plane of the β-Ga$_2$O$_3$-based single crystal constituting the epitaxial growth substrate 1. Therefore, it is possible to produce the MESFET 5 with high performance and stable quality.

Fourth Embodiment

Figure 12:
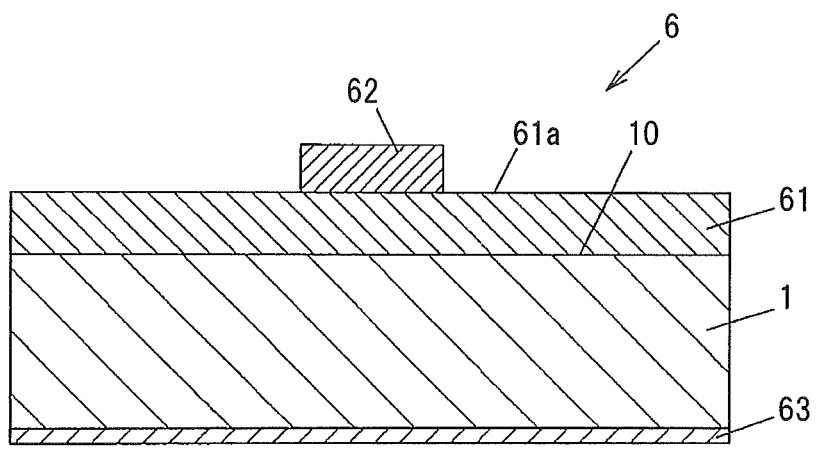
FIG. 12 is a cross sectional view showing an example structure of a Schottky-barrier diode in a fourth embodiment of the invention.

Next, the fourth embodiment of the invention will be described in reference to FIG. 12. FIG. 12 is a cross sectional view showing an example structure of a Schottky-barrier diode which is another example of the semiconductor device in the present embodiment.

In this Schottky-barrier diode 6, the epitaxial growth substrate 1 in the first embodiment is provided as an element substrate and an n-type β-Ga$_2$O$_3$ layer 61 formed by epitaxial growth is provided on the main surface 10 (the (010) plane) of the epitaxial growth substrate 1.

A Schottky electrode 62 is provided on the n-type β-Ga$_2$O$_3$ layer 61 and is in Schottky-contact with a surface 61a of the n-type β-Ga$_2$O$_3$ layer 61. Meanwhile, an ohmic electrode 63 is provided on a surface of the epitaxial growth substrate 1 opposite to the n-type β-Ga$_2$O$_3$ layer 61 and is ohmic contact with the epitaxial growth substrate 1.

In addition, the epitaxial growth substrate 1 in the fourth embodiment is formed to have an n-type conductivity by oxygen loss or impurity doping. The n-type β-Ga$_2$O$_3$ layer 61 is formed to have a lower donor concentration than the epitaxial growth substrate 1.

When forward voltage (electric potential is positive on the Schottky electrode 62 side) is applied to the Schottky diode 6, electric current is increased due to electron transfer from the epitaxial growth substrate 1 to the n-type β-Ga$_2$O$_3$ layer 61. As a result, a forward current flows from the Schottky electrode 62 to the ohmic electrode 63.

On the other hand, when reverse voltage (electric potential is negative on the Schottky electrode layer 2 side) is applied to the Schottky diode 6, substantially no electric current flows through the Schottky diode 6.

Effects of the Fourth Embodiment

In the fourth embodiment, the n-type β-Ga$_2$O$_3$ layer 61 having a steep interface with a highly accurate thickness can be formed on the main surface 10 which is the (010) plane of the β-Ga$_2$O$_3$-based single crystal constituting the epitaxial growth substrate 1. Therefore, it is possible to produce the Schottky diode 6 with high performance and stable quality.

Other Embodiments

Although the preferred embodiments of the invention have been described above, the present invention is not intended to be limited to these embodiments, and the various kinds of modifications and applications can be implemented without departing from the gist thereof.

Although, for example, the main surface is the (010) plane or the (310) plane of the β-Ga$_2$O$_3$-based single crystal in the above-mentioned first embodiment and the modification thereof, the main surface may be a plane between the (010) plane and the (310) plane. Alternatively, the main surface may be a plane inclined at an angle equal to or smaller than 37.5° in a direction other than the direction between the (010) plane and the (310) plane.

In addition, although the i-type β-(AlGa)$_2$O$_3$ layer 41 is formed on the epitaxial growth substrate 1 having the (010) plane as the main surface 10 in the second embodiment, the high-electron-mobility transistor may be formed by providing the i-type β-(AlGa)$_2$O$_3$ layer 41 on the epitaxial growth substrate 1B having the (310) plane as the main surface 10B. Furthermore, the main surface may be a plane inclined at an angle equal to or smaller than 37.5° from the (010) plane and the i-type β-(AlGa)$_2$O$_3$ layer 41 may be formed on such a main surface.

In addition, although the n-type β-Ga$_2$O$_3$ layer 51/the n-type β-Ga$_2$O$_3$ layer 61 is formed on the epitaxial growth substrate 1 having the (010) plane as the main surface 10 in the third/fourth embodiment, the main surface may be a plane inclined at an angle equal to or smaller than 37.5° from the (010) plane and the n-type β-Ga$_2$O$_3$ layer 51/the n-type β-Ga$_2$O$_3$ layer 61 may be formed on such a main surface.

In addition, although the case where the invention is applied to the epitaxial growth substrate of the high-electron-mobility transistor, the MESFET and the Schottky-barrier diode has been described in the second to fourth embodiments, semiconductor devices to which the invention is applied are not limited thereto.

INDUSTRIAL APPLICABILITY

An epitaxial growth substrate, which allows an improvement in the crystalline quality of a Ga-containing oxide layer formed on the β-Ga$_2$O$_3$ single crystal substrate, and a crystal laminate structure are provided.

REFERENCE SIGNS LIST 1, 1B: epitaxial growth substrate
2, 2A: crystal laminate structure
3: MBE system
4: high-electron-mobility transistor
5: MESFET
6: Schottky-barrier diode
10, 10B: main surface
20: epitaxial crystal
20a: satellite peak
21: (AlGa)$_2$O$_3$ layer
21a: satellite peak
21b: fringe peak 21b
22: Ga$_2$O$_3$ layer
30: vacuum chamber
31: substrate holder
32: heating device
33 (33a to 33d): cell
34 (34a to 34d): heater
35: gas supply pipe
36: vacuum pump
41: i-type β-(AlGa)$_2$O$_3$ layer
42: n-type β-(AlGa)$_2$O$_3$ layer
42a: surface
43d: drain electrode
43g: gate electrode
43s: source electrode
51: n-type β-Ga$_2$O$_3$ layer
52d: drain electrode
52g: gate electrode
52s: source electrode
61: n-type β-Ga$_2$O$_3$ layer
62: Schottky electrode
63: ohmic electrode
310: shaft

What is claimed is:

1. A crystal laminate structure, comprising:
an epitaxial growth substrate comprising a β-Ga$_2$O$_3$-based single crystal and a (010) plane or a plane inclined at an angle not more than 37.5° with respect to the (010) plane as a main surface thereof and additional elements doped therewith so as to increase an electrical resistance of the β-Ga$_2$O$_3$-based single crystal; and
an epitaxial crystal formed on the main surface of the epitaxial growth substrate,
wherein the epitaxial crystal comprises a Ga-containing oxide, and
wherein the main surface comprises a plane between the (010) plane and a (310) plane of the β-Ga$_2$O$_3$-based single crystal.

2. The crystal laminate structure according to claim 1, wherein the epitaxial crystal comprises an n-type epitaxial crystal.

3. The crystal laminate structure according to claim 2, wherein the epitaxial crystal comprises an n-type β-Ga$_2$O$_3$ single crystal.

4. The crystal laminate structure according to claim 1, wherein the epitaxial crystal comprises an i-type epitaxial crystal.

5. The crystal laminate structure according to claim 4, wherein the epitaxial crystal comprises an i-type β-Ga$_2$O$_3$ single crystal.

6. The crystal laminate structure according to claim 1, wherein the epitaxial crystal comprises a crystal laminate structure in which a Ga$_2$O$_3$ layer and a (AlGa)$_2$O$_3$ layer are alternately formed.

7. The crystal laminate structure according to claim 1, wherein the additional elements comprise group II elements.

8. The crystal laminate structure according to claim 1, wherein the additional elements comprise Mg.

9. The crystal laminate structure according to claim 1, wherein the main surface comprises the (310) plane of the β-Ga$_2$O$_3$-based single crystal.

10. The crystal laminate structure according to claim 1, wherein the epitaxial crystal comprises a crystalline body comprising a β-Gallia structure containing Ga.

11. The crystal laminate structure according to claim 1, wherein, in the crystal laminate structure, a plurality of (AlGa)$_2$O$_3$ layers and a plurality of Ga$_2$O$_3$ layers are alternately formed on the main surface of the epitaxial growth substrate.

12. The crystal laminate structure according to claim 1, wherein the epitaxial crystal comprises an n-type epitaxial crystal having a first donor concentration.

13. A crystal laminate structure, comprising:
an epitaxial growth substrate comprising a β-Ga$_2$O$_3$-based single crystal and a (010) plane or a plane inclined at an angle not more than 37.5° with respect to the (010) plane as a main surface thereof and additional elements doped therewith so as to increase an electrical resistance of the β-Ga$_2$O$_3$-based single crystal; and an epitaxial crystal formed on the main surface of the epitaxial growth substrate,
wherein the epitaxial crystal comprises a Ga-containing oxide,
wherein the epitaxial crystal comprises an n-type epitaxial crystal having a first donor concentration, and
wherein the n-type epitaxial crystal has a second donor concentration lower than the first donor concentration.

* * * * *